United States Patent
Maffeis

(10) Patent No.: US 9,836,351 B2
(45) Date of Patent: Dec. 5, 2017

(54) METHOD FOR DECODING BITS IN A SOLID STATE DRIVE, AND RELATED SOLID STATE DRIVE

(71) Applicant: NandEXT S.r.l., Località Dogana (SM)

(72) Inventor: Margherita Maffeis, Dalmine (IT)

(73) Assignee: NandEXT Srl, Localita Dogana (SM)

( * ) Notice: Subject to any disclaimer, the term of this patent is extended or adjusted under 35 U.S.C. 154(b) by 72 days.

(21) Appl. No.: 15/076,415

(22) Filed: Mar. 21, 2016

(65) Prior Publication Data

US 2017/0269995 A1 Sep. 21, 2017

(51) Int. Cl.
*G06F 11/10* (2006.01)
*G11C 16/26* (2006.01)
*G11C 16/10* (2006.01)
*G11C 29/52* (2006.01)
*G06F 3/06* (2006.01)

(52) U.S. Cl.
CPC .......... *G06F 11/1068* (2013.01); *G06F 3/064* (2013.01); *G06F 3/0619* (2013.01); *G06F 3/0679* (2013.01); *G11C 16/10* (2013.01); *G11C 16/26* (2013.01); *G11C 29/52* (2013.01)

(58) Field of Classification Search
CPC .. G06F 11/1068; G06F 11/1072; G06F 11/10; G06F 3/064; G06F 3/0679; G06F 3/0619; G11C 16/26; G11C 29/52
See application file for complete search history.

(56) References Cited

U.S. PATENT DOCUMENTS

| | | | | |
|---|---|---|---|---|
| 7,814,401 B2* | 10/2010 | Alrod | ................. | G06F 11/1068 714/763 |
| 9,007,854 B1* | 4/2015 | Nemati Anaraki | ..... | G06F 11/10 365/189.09 |
| 2014/0071761 A1* | 3/2014 | Sharon | ................. | G11C 16/26 365/185.18 |

* cited by examiner

*Primary Examiner* — Shelly A Chase
(74) *Attorney, Agent, or Firm* — Janeway Patent Law PLLC

(57) ABSTRACT

A method is proposed for decoding bits stored in memory cells of a solid state drive. Each memory cell comprises a floating gate transistor adapted to store a bit pattern, among a plurality of possible bit patterns, when programmed at a threshold voltage associated with that bit pattern, each threshold voltage being variable over the memory cells thereby defining, for each bit pattern, a corresponding threshold voltage distribution. The bit pattern of each memory cell comprises first and second bits, and the solid state drive is suitable for reading the bit patterns based on fixed reference voltages, each one designed to discern between two respective adjacent threshold voltage distributions, and on additional reference voltages different from the fixed reference voltages. The solid state drive is capable of soft decoding the read bit patterns based on soft information.

36 Claims, 8 Drawing Sheets

METHOD FOR DECODING BITS IN A SOLID STATE DRIVE, AND RELATED SOLID STATE DRIVE

BACKGROUND OF THE INVENTION

Field of the Invention

Figure 1A:
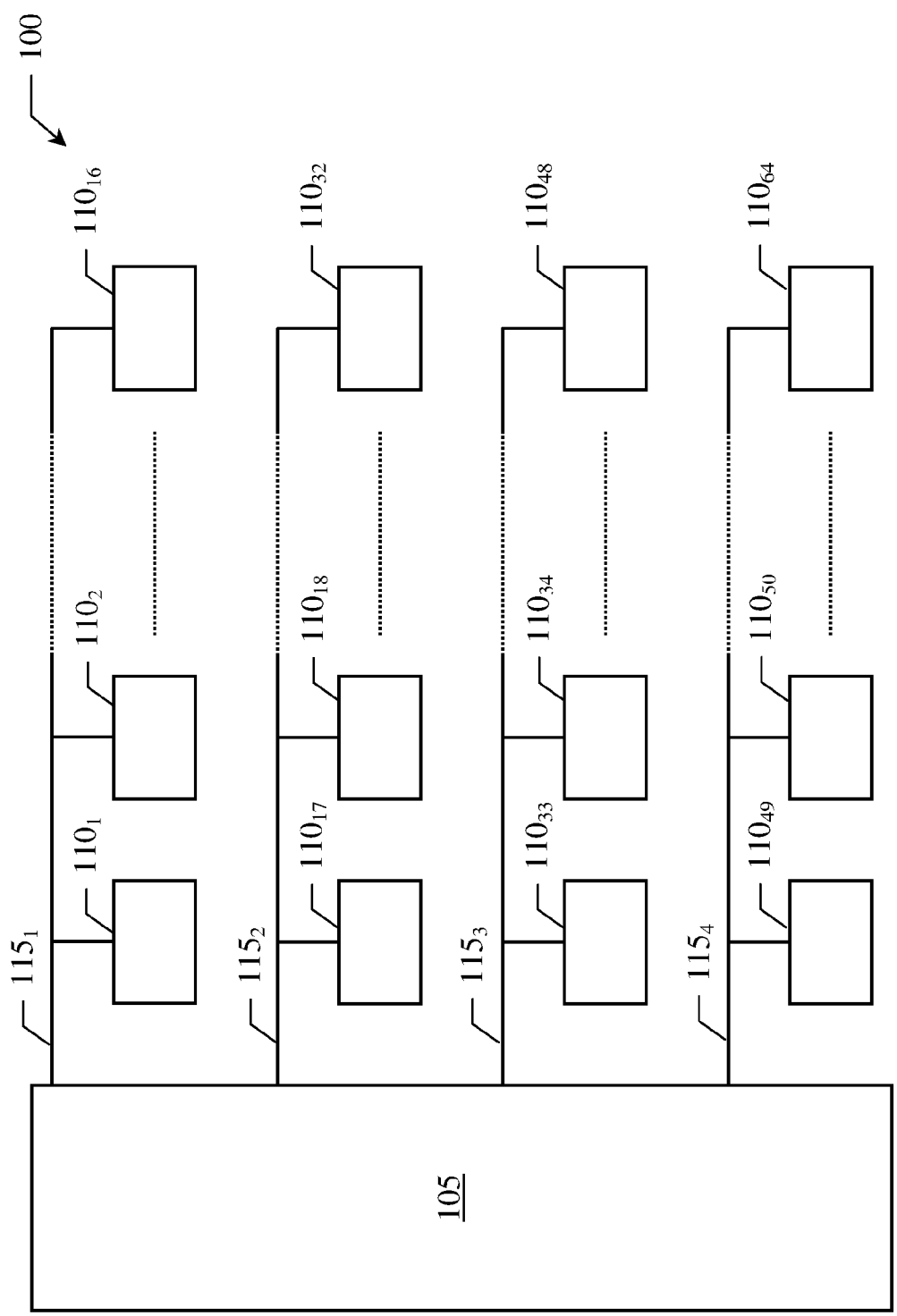

The present invention generally relates to "Solid State Drives" (hereinafter, SSD devices), such as SSD devices provided with non-volatile memory chips (e.g., NAND flash memory chips) for storing bits. More particularly, the present invention relates to SSD devices provided with error correction capabilities. Even more particularly, the present invention relates to a method for decoding bits in such SSD devices, and to SSD devices (or controllers thereof) implementing the method.

Overview of the Related Art

SSD devices are nowadays widely used, for example as storage units of computers in replacement of HDD ("Hard Disk Drives").

A common SSD device comprises non-volatile memory chips (for example, NAND flash memory chips) each one comprising non-volatile memory cells for storing data (bits) even in the absence of external power supply, and a SSD device controller (hereinafter, SSD controller) for managing SSD device operations, such as write/program, erase and read operations.

Each memory cell comprises a floating gate transistor. Each bit or group of bits (identifying a respective logical state of the memory cell) is physically stored in each memory cell in the form of electric charge in the floating gate, which defines a corresponding threshold voltage of the transistor. The number of bits each memory cell is capable of storing depends on memory cell technology. For example, in "Single-Level Cell" (SLC) technology each memory cell (or SLC memory cell) is capable of storing one symbol (or bit pattern) comprising one bit (i.e. two logical states, 0 or 1, defining two threshold voltages), in "Multi-Level Cell" (MLC) technology each memory cell (or MLC memory cell) is capable of storing one symbol comprising more than one bit, typically two bits (i.e. four logical states, 00, 01, 10, or 11, defining four threshold voltages), whereas in "Tri-Level Cell" technology each memory cell (or TLC memory cell) is capable of storing one symbol comprising three bits (i.e. eight logical states, 000, 001, 010, 011, 100, 101, 110 or 111, defining eight threshold voltages).

While, ideally, all memory cells in a memory chip should feature same (nominal) threshold voltages for same logical states (or, equivalently, for same symbols), practically each threshold voltage associated with a corresponding logical state (or, equivalently, with a corresponding symbol) differs across the memory cells and defines a respective threshold voltage distribution (typically, a Gaussian-type probability distribution), thus resulting in a number of threshold voltage distributions equal to the possible logical states each memory cell can take.

Ideally, the threshold voltage distributions are spaced apart from one another, and a corresponding reference voltage is set between each pair of adjacent threshold voltage distributions for sensing/reading the logical state of the memory cells. This is schematically shown in the top drawing of FIG. 2B for a 2-bit MLC memory cell (hereinafter referred to as MLC memory cell for the sake of conciseness) and in the top drawing of FIG. 2C for a TCL memory cell. In such figures the threshold voltage distributions are denoted by $D_j$ (j ranging from 1 to 4 for the MLC memory cell and from 1 to 8 for the TLC memory cell).

Figure 2A:
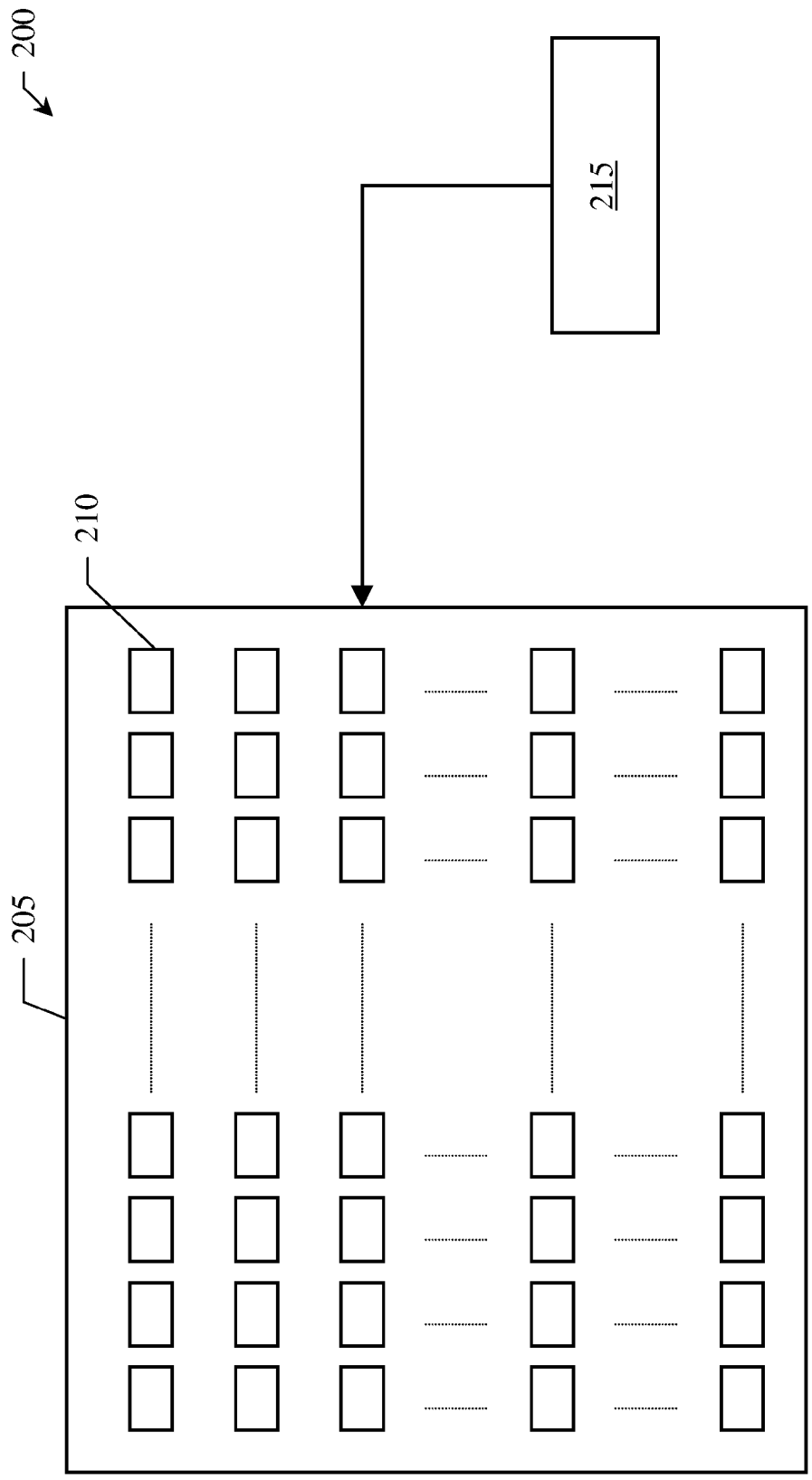
Figure 2B:
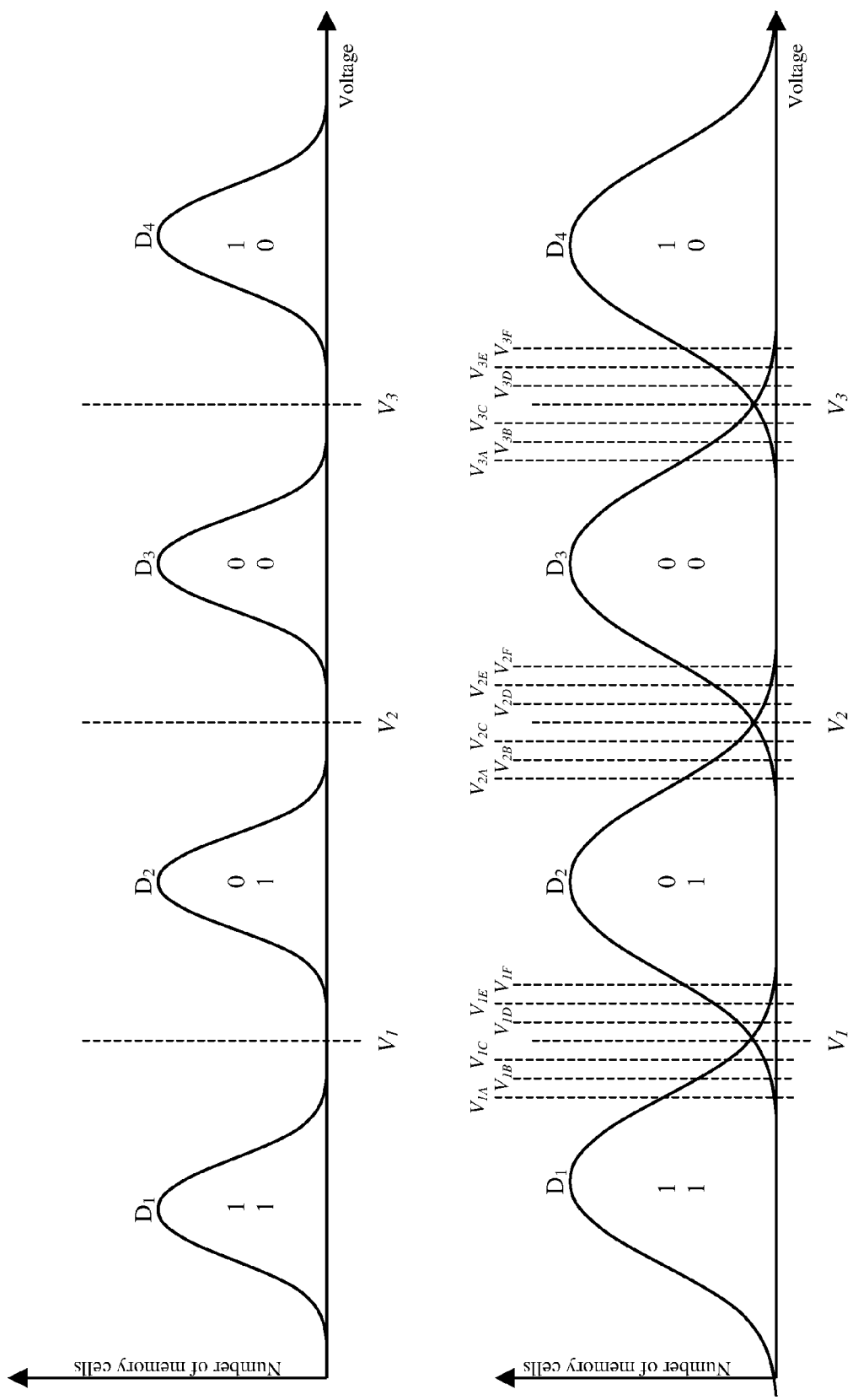
Figure 2C:
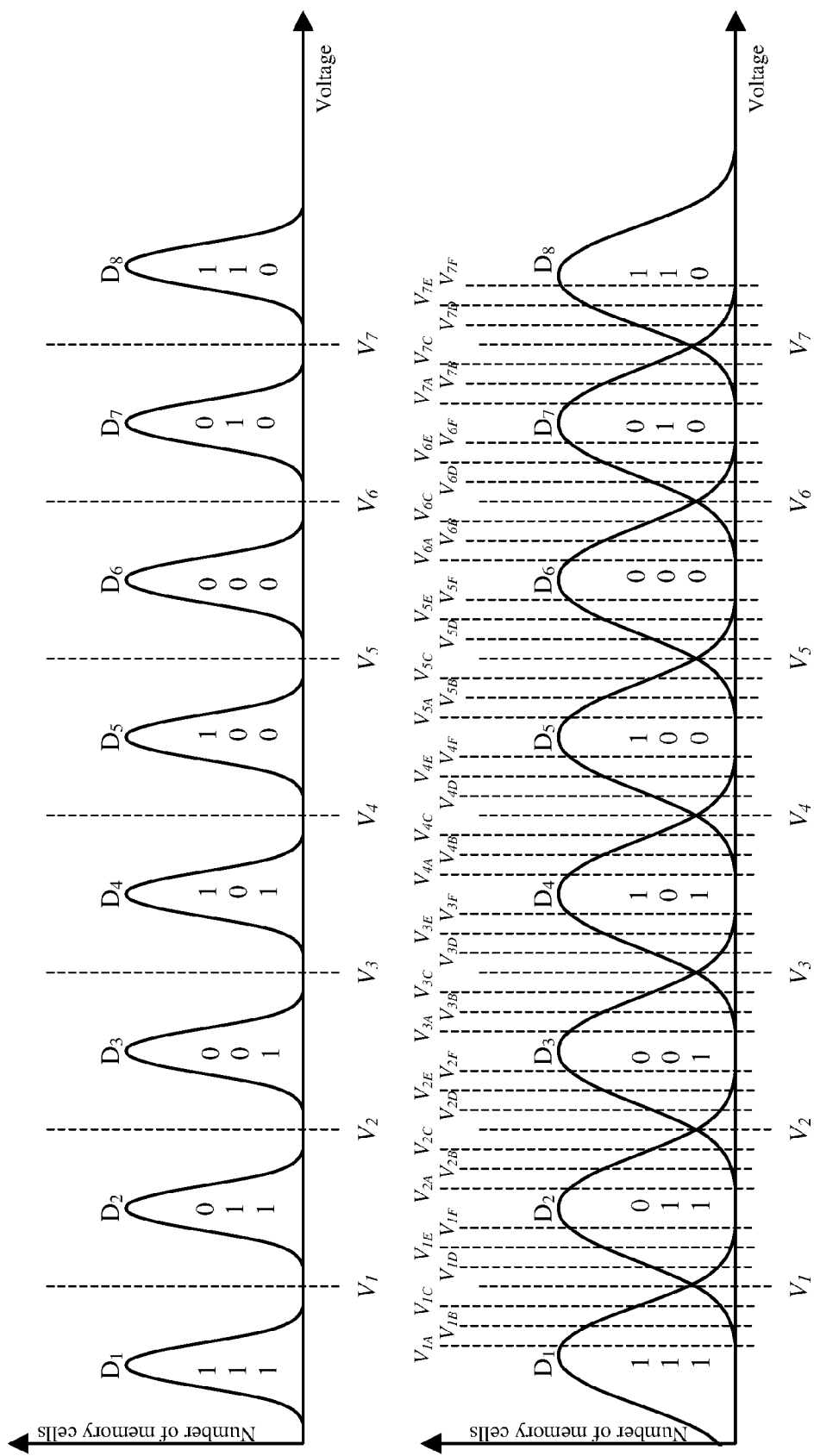

As visible in these drawings, the threshold voltage distributions $D_j$ are (ideally) spaced apart from one another, and a corresponding reference voltage $V_k$ (usually referred to as hard reference voltage) is set between each pair of adjacent threshold voltage distributions $D_j$ for sensing/reading the logical state of the memory cells (k=1, 2, 3 in the example of FIG. 2B and k=1, 2, 3, 4, 5, 6, 7 in the example of FIG. 2C).

In case of the MLC memory cell, during a read operation a threshold voltage below the hard reference voltage $V_1$ represents the symbol "11", a threshold voltage between the hard reference voltages $V_1$ and $V_2$ represents the symbol "01", a threshold voltage between the hard reference voltages $V_2$ and $V_3$ represents the symbol "00", and a threshold voltage above the hard reference voltage $V_3$ represents the symbol "10".

In case of the TLC memory cell, during a read operation, a threshold voltage below the hard reference voltage $V_1$ represents the symbol "111", a threshold voltage between the hard reference voltages $V_1$ and $V_2$ represents the symbol "011", a threshold voltage between the hard reference voltages $V_2$ and $V_3$ represents the symbol "001", a threshold voltage between the hard reference voltages $V_3$ and $V_4$ represents the symbol "101", a threshold voltage between the hard reference voltages $V_4$ and $V_5$ represents the symbol "100", a threshold voltage between the hard reference voltages $V_5$ and $V_6$ represents the symbol "000", a threshold voltage between the hard reference voltages $V_6$ and $V_7$ represents the symbol "010", and a threshold voltage above the hard reference voltage $V_7$ represents the symbol "110".

To read a memory cell, the threshold voltage of that memory cell (i.e., the threshold voltage to which that memory cell is responsive) is compared to the hard reference voltages $V_k$. Typically, reading a memory cell that stores a symbol of m bits requires, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

However, the increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference and retention noise, which translates into partially overlapping areas of adjacent threshold voltage distributions $D_j$ (shown in the bottom drawings of FIGS. 2B and 2C) and, hence, into the increasing of the number of bit errors.

In order to compensate for larger bit errors, and to increase SSD device reliability, "Forward Error Correction" has been proposed (and typically implemented in the SSD controller) for locating and correcting bit errors. According to "Forward Error Correction" principles, the bits to be stored are encoded in a redundant way (e.g., by adding parity bits) by means of an "Error Correction Code" (ECC code), so that redundancy allows detecting a limited number of bit errors that may occur anywhere in the read bits, and to correct these errors. Generally, the number of detectable and correctable bit errors increases as the number of parity bits in the ECC code increases.

The probability of corrupted read bits, which therefore contains incorrect bits, before correction is referred to as "Raw Bit Error Rate" (RBER). The RBER is typically estimated (e.g., by the SSD controller) according to a shape of the threshold voltage distributions $D_j$, and particularly according to the overlapping areas of the adjacent threshold voltage distributions $D_j$.

As a result of the advances in memory cell technology, the RBER for selected memory cells is increasingly nearing the Shannon limit of the communication channel. The RBER observed after application of the ECC code is referred to as "Frame Bit Error Rate" (FER), whereas the FER divided by the number of read bits is referred to as "Uncorrectable Bit Error Rate" (UBER).

The acceptable UBER is often dependent upon the application in which the SSD device is intended to be employed. In the case of price sensitive, consumer applications, which experience a relatively low number of accesses (e.g., program/erase cycles), the SSD device may tolerate a higher UBER as compared to a high-end application experiencing a relatively high number of accesses, such as an enterprise application.

To achieve an acceptable UBER, especially for enterprise applications, ECC codes such as "Low-Density Parity-Check" (LDPC) codes have been widely used (both alone and in combination with other ECC codes), which allow determining each bit value by means of hard bits (i.e., the read bits resulting from comparisons to the hard reference voltages $V_k$) and of additional information including soft bits and an indication of the reliability of each read soft bit typically evaluated according to RBER—the decoding based on the hard and soft bits being referred to as hard and soft decoding, respectively.

In the known solutions, the soft bits mainly arise from multiple read operations. Indeed, according to a common approach, when a read operation takes place on selected memory cells, and the number of bit errors is found to be higher than correction capabilities of the "Forward Error Correction", the flash memory device (e.g., the SSD controller thereof) is typically configured to reread the selected memory cells at different values of the reference voltages to attempt to establish the bits in those areas of the threshold voltage distributions $D_j$ wherein bit error is most likely. Such multiple readings are typically carried out by moving the hard reference voltages $V_k$ in a neighborhood thereof, thus obtaining a number of additional reference voltages (or soft reference voltages) $V_{kA}$-$V_{kF}$ associated with each hard reference voltage $V_k$ (in the following the overall reference voltages including both the hard reference voltages $V_k$ and the associated soft reference voltages $V_{kA}$-$V_{kF}$ will be also denoted, as a whole, by reference voltages $V_{kA}$, $V_{kA}$-$V_{kF}$ for the sake of conciseness).

SUMMARY OF THE INVENTION

The Applicant has recognized that nowadays SSD devices, especially those currently most widespread (i.e., the SSD devices based on MLC and TLC technologies, hereinafter referred to as MLC and TLC SSD devices) are not satisfactory.

Indeed, according to the Applicant, increasing the number of the soft reference voltages $V_{kA}$-$V_{kF}$, and hence of the reads and of the soft bits, could result in a dramatic increase of the required bandwidth.

This translates into expensive read access times (and, hence, in latency overhead) of the SSD device.

These issues are exacerbated in nowadays SSD devices, which are smaller and smaller and whose bits per memory cell are increasingly growing, as the narrow distance between the threshold voltage distributions $D_j$ requires more and more soft bits to allow correct soft decoding. For example, a typical (2-bit) MLC SSD device may need 21 references voltages $V_{kA}$, $V_{kA}$-$V_{kF}$ (as illustrated in the bottom drawing of FIG. 2B) or more thereof (depending on the desired resolution) for both hard and soft decoding (as compared to 3 hard reference voltages $V_k$ needed for only hard decoding), whereas a typical TLC SSD device may need 49 references voltages $V_{kA}$, $V_{kA}$-$V_{kF}$ (as illustrated in the bottom drawing of FIG. 2C) or more thereof (depending on the desired resolution) for both hard and soft decoding (as compared to the 7 hard reference voltages $V_k$ needed for only hard decoding).

The Applicant has tackled the above-discussed issues, and has devised a method (and a corresponding SSD device, or controller thereof, implementing the method) for improving bit decoding with no latency overheads.

One or more aspects of the present invention are set out in the independent claims, with advantageous features of the same invention that are indicated in the dependent claims, whose wording is enclosed herein verbatim by reference (with any advantageous feature being provided with reference to a specific aspect of the present invention that applies mutatis mutandis to any other aspect thereof).

More specifically, an aspect of the present invention relates to a method for decoding bits stored in memory cells of a solid state drive. Each memory cell comprises a floating gate transistor adapted to store a bit pattern, among a plurality of possible bit patterns, when programmed at a threshold voltage associated with that bit pattern, each threshold voltage being variable over the memory cells thereby defining, for each bit pattern, a corresponding threshold voltage distribution. The bit pattern of each memory cell comprises first and second bits, and the solid state drive is suitable for reading the bit patterns based on fixed reference voltages, each one designed to discern between two respective adjacent threshold voltage distributions, and on additional reference voltages different from the fixed reference voltages. The solid state drive is capable of soft decoding the read bit patterns based on soft information. The method comprises:

reading the first and second bits of the memory cells based on the fixed reference voltages, to obtain read first bits and read second bits, and soft decoding the read first bits, wherein the soft information exploited for soft decoding the read first bits are based on the read second bits.

According to an embodiment of the present invention, the method further comprises, after said reading the first and second bits based on the fixed reference voltages, hard decoding the read first bits. Preferably, said soft decoding the read first bits is carried out in case of a failure of said hard decoding.

According to an embodiment of the present invention, said fixed reference voltages comprise a first fixed reference voltage, and second and third fixed reference voltages lower and higher, respectively, than the first fixed reference voltage. Preferably, said reading the first and second bits based on the fixed reference voltages comprises reading the first bits based on the first fixed reference voltage, and reading the second bits based on the second and third fixed reference voltages. More preferably, the method further comprises, if a number of errors of the soft decoded first bits is higher than a predetermined number of errors:

determining a reliability of each read first bit based on at least one additional reading of the first bits, said additional reading being based on at least one first additional reference voltage in the neighborhood of the first fixed reference voltage, wherein the soft information exploited for soft decoding the read first bits are based also on said reliability of each read first bit.

According to an embodiment of the present invention, the solid state drive is designed to read the memory cells at memory page level. Preferably, the first and second bits of the bit patterns stored in the memory cells identify, as a whole, first and second memory pages, respectively, of the solid state drive.

According to an embodiment of the present invention, the first and second memory pages are adjacent memory pages.

According to an embodiment of the present invention, each memory cell is capable of storing a bit pattern of two bits, the first and second bits of each memory cells preferably representing, respectively, most and least significant bits of the respective bit pattern.

According to an embodiment of the present invention, each memory cell is capable of storing a bit pattern of three bits comprising a third bit, the first, second and third bits of each memory cells preferably representing, respectively, most, central and least significant bits of the respective bit pattern.

According to an embodiment of the present invention, the method further comprises:

reading the third bits of the memory cells based on the fixed reference voltages, thereby obtaining read third bits, the soft information exploited for soft decoding the read first bits being based also on the read third bits.

According to an embodiment of the present invention, the method further comprises:

hard decoding the read second bits, and if a number of errors of the hard decoded second bits is higher than a predetermined number of errors, reading the third bits of the memory cells based on the fixed reference voltages, thereby obtaining read third bits, and soft decoding the read second bits, wherein the soft information exploited for soft decoding the read second bits are based on the read third bits.

According to an embodiment of the present invention, the method further comprises, after said hard decoding the read first bits:

if said hard decoding is successful, determining a number of errors of the decoded read first bits, and if the number of errors of the decoded read first bits is higher than a predetermined number of errors indicative that the hard decoding of the same read first bits is expected to fail at a following hard decoding, identifying the read first bits as critical read first bits, said hard decoding the read first bits comprising hard decoding only the read first bits that are not critical read first bits.

According to an embodiment of the present invention, said soft decoding is based on a "Low Density Parity Check" (LDPC) code.

Another aspect of the present invention proposes a controller for a solid state drive. The solid state drive comprises memory cells each one having a floating gate transistor adapted to store a bit pattern, among a plurality of possible bit patterns, when programmed at a threshold voltage associated with that bit pattern, each threshold voltage being variable over the memory cells thereby defining, for each bit pattern, a corresponding threshold voltage distribution. The bit pattern of each memory cell comprises first and second bits. The controller comprises a control unit arranged for:

causing a reading unit to read the first and second bits of the memory cells based on fixed reference voltages to obtain read first bits and read second bits, wherein each fixed reference voltage is designed to discern between two respective adjacent threshold voltage distributions, and causing a soft decoding unit to soft decode the read first bits based on soft information, wherein the soft information exploited for soft decoding the read first bits are based on the read second bits.

According to an embodiment of the present invention, the control unit is further arranged for causing a hard decoding unit to hard decode the read first bits after said reading the first and second bits based on the fixed reference voltages. Preferably, the control unit is arranged for causing the soft decoding unit to soft decode the read first bits in case of a failure of said hard decoding.

According to an embodiment of the present invention, said reference voltages comprise a first fixed reference voltage, and second and third fixed reference voltages lower and higher, respectively, than the first fixed reference voltage. Preferably, said causing the reading unit to read the first and second bits based on the fixed reference voltages comprises causing the reading unit to read the first bits based on the first fixed reference voltage, and to read the second bits based on the second and third fixed reference voltages. More preferably, the control unit is further arranged for, if a number of errors of the soft decoded first bits is higher than a predetermined number of errors:

determining a reliability of each read first bit based on at least one additional reading of the first bits, said additional reading being based on at least one first additional reference voltage in the neighborhood of the first fixed reference voltage, wherein the soft information exploited for soft decoding the read first bits are based also on said reliability of each read first bit.

According to an embodiment of the present invention, the memory cells are read at memory page level, the first and second bits of the bit patterns stored in the memory cells preferably identifying, as a whole, first and second memory pages, respectively, of the solid state drive.

According to an embodiment of the present invention, the first and second memory pages are adjacent memory pages.

According to an embodiment of the present invention, each memory cell is capable of storing a bit pattern of two bits, the first and second bits of each memory cells preferably representing, respectively, most and least significant bits of the respective bit pattern.

According to an embodiment of the present invention, each memory cell is capable of storing a bit pattern of three bits comprising a third bit, the first, second and third bits of each memory cells preferably representing, respectively, most, central and least significant bits of the respective bit pattern.

According to an embodiment of the present invention, the control unit is further arranged for causing the reading unit to read the third bits of the memory cells based on the fixed reference voltages, thereby obtaining read third bits, the soft information exploited for soft decoding the read first bits being based also on the read third bits.

According to an embodiment of the present invention, the control unit is further arranged for:

causing a hard decoding unit of the solid state drive to hard decode the read second bits, and if a number of errors of the hard decoded second bits is higher than a predetermined number of errors, causing the reading unit to read the third bits of the memory cells based on the fixed reference voltages, thereby obtaining read third bits, and causing the soft decoding unit to soft decode the read second bits, wherein the soft information exploited for soft decoding the read second bits are based on the read third bits.

According to an embodiment of the present invention, the control unit is further arranged for, after said hard decoding the read first bits:

if said hard decoding is successful, determining a number of errors of the decoded read first bits, and if the number of errors of the decoded read first bits is higher than a predetermined number of errors indicative that the hard decoding of the same read first bits is expected to fail at a following hard decoding, identifying the read first bits as critical read first bits, said hard decoding the read first bits comprising hard decoding only the read first bits that are not critical read first bits.

According to an embodiment of the present invention, said soft decoding is based on a "Low Density Parity Check" (LDPC) code.

A further aspect of the present invention proposes a solid state drive comprising:

memory cells each one having a floating gate transistor adapted to store a bit pattern, among a plurality of possible bit patterns, when programmed at a threshold voltage associated with that bit pattern, each threshold voltage being variable over the memory cells thereby defining, for each bit pattern, a corresponding threshold voltage distribution, wherein the bit pattern of each memory cell comprises first and second bits, and a control unit arranged for:

causing a reading unit to read the first and second bits of the memory cells based on fixed reference voltages to obtain read first bits and read second bits, wherein each fixed reference voltage is designed to discern between two respective adjacent threshold voltage distributions, and causing a soft decoding unit to soft decode the read first bits based on soft information, wherein the soft information exploited for soft decoding the read first bits are based on the read second bits.

According to an embodiment of the present invention, the control unit is further arranged for causing a hard decoding unit to hard decode the read first bits after said reading the first and second bits based on the fixed reference voltages. Preferably, the control unit is arranged for causing the soft decoding unit to soft decode the read first bits in case of a failure of said hard decoding.

According to an embodiment of the present invention, said reference voltages comprise a first fixed reference voltage, and second and third fixed reference voltages lower and higher, respectively, than the first fixed reference voltage. Preferably, said causing the reading unit to read the first and second bits based on the fixed reference voltages comprises causing the reading unit to read the first bits based on the first fixed reference voltage, and to read the second bits based on the second and third fixed reference voltages. More preferably, the control unit is further arranged for, if a number of errors of the soft decoded first bits is higher than a predetermined number of errors:

determining a reliability of each read first bit based on at least one additional reading of the first bits, said additional reading being based on at least one first additional reference voltage in the neighborhood of the first fixed reference voltage, wherein the soft information exploited for soft decoding the read first bits are based also on said reliability of each read first bit.

According to an embodiment of the present invention, the memory cells are read at memory page level, the first and second bits of the bit patterns stored in the memory cells preferably identifying, as a whole, first and second memory pages, respectively, of the solid state drive.

According to an embodiment of the present invention, the first and second memory pages are adjacent memory pages.

According to an embodiment of the present invention, each memory cell is capable of storing a bit pattern of two bits, the first and second bits of each memory cells preferably representing, respectively, most and least significant bits of the respective bit pattern.

According to an embodiment of the present invention, each memory cell is capable of storing a bit pattern of three bits comprising a third bit, the first, second and third bits of each memory cells preferably representing, respectively, most, central and least significant bits of the respective bit pattern.

According to an embodiment of the present invention, the control unit is further arranged for causing the reading unit to read the third bits of the memory cells based on the fixed reference voltages, thereby obtaining read third bits, the soft information exploited for soft decoding the read first bits being based also on the read third bits.

According to an embodiment of the present invention, the control unit is further arranged for:

causing a hard decoding unit of the solid state drive to hard decode the read second bits, and if a number of errors of the hard decoded second bits is higher than a predetermined number of errors, causing the reading unit to read the third bits of the memory cells based on the fixed reference voltages, thereby obtaining read third bits, and causing the soft decoding unit to soft decode the read second bits, wherein the soft information exploited for soft decoding the read second bits are based on the read third bits.

According to an embodiment of the present invention, the control unit is further arranged for, after said hard decoding the read first bits:

if said hard decoding is successful, determining a number of errors of the decoded read first bits, and if the number of errors of the decoded read first bits is higher than a predetermined number of errors indicative that the hard decoding of the same read first bits is expected to fail at a following hard decoding, identifying the read first bits as critical read first bits, said hard decoding the read first bits comprising hard decoding only the read first bits that are not critical read first bits.

According to an embodiment of the present invention, said soft decoding is based on a "Low Density Parity Check" (LDPC) code.

According to an embodiment of the present invention, said soft decoding unit is based on a "Low Density Parity Check" (LDPC) code.

According to an embodiment of the present invention, the memory cells are flash memory cells.

According to an embodiment of the present invention, said memory cells are NAND flash memory cells.

BRIEF DESCRIPTION OF THE ANNEXED DRAWINGS

Figure 1B:
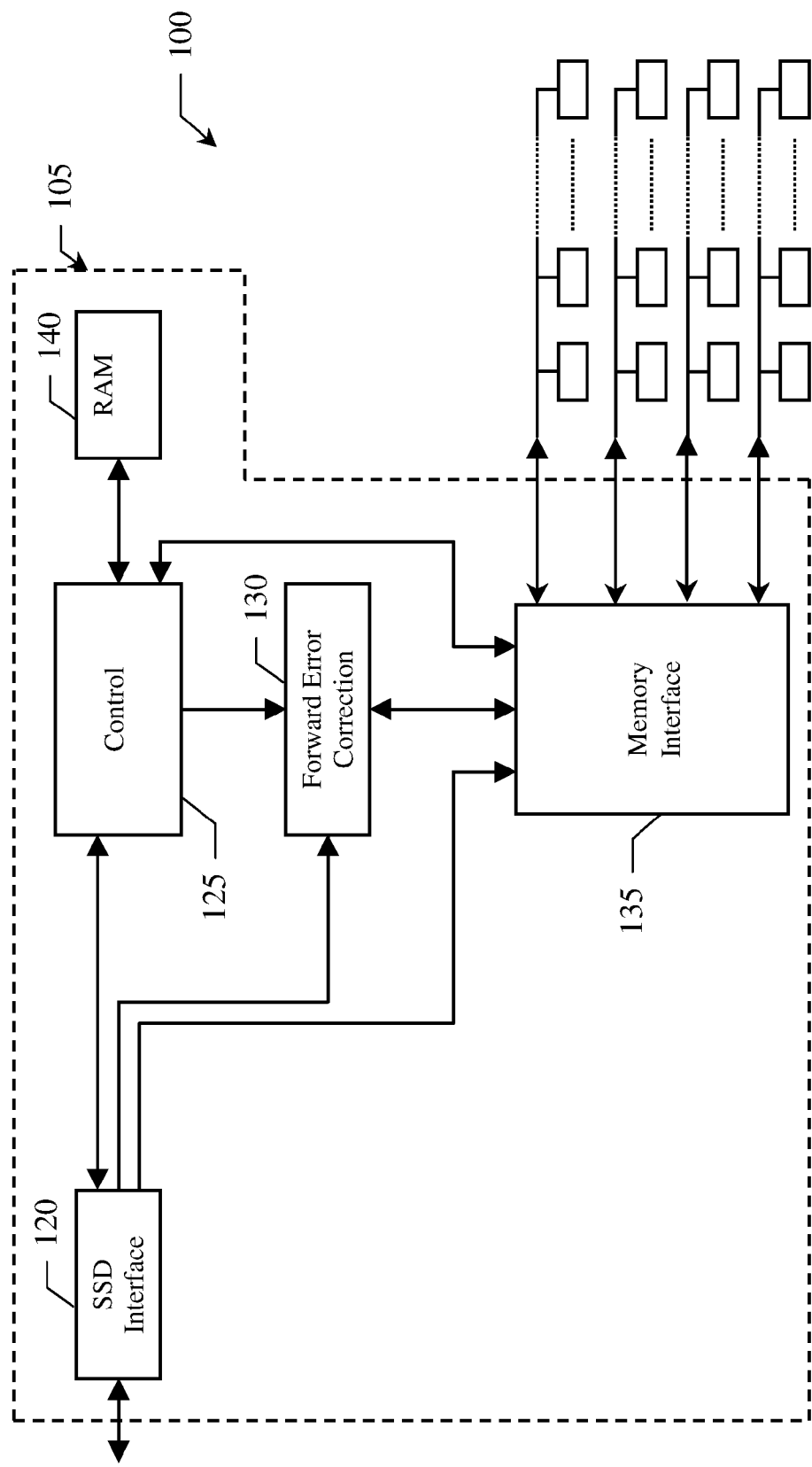
Figure 3A:
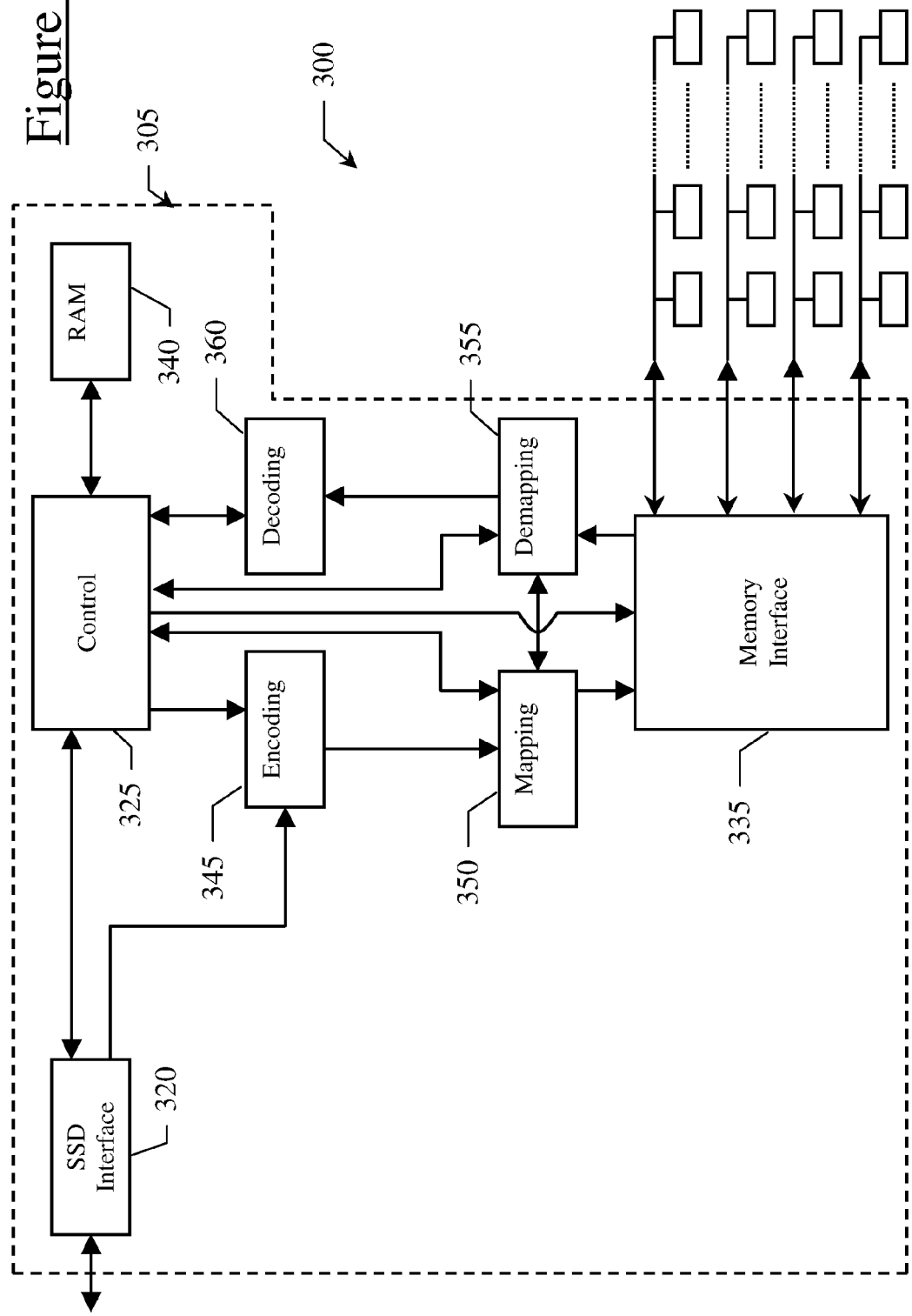
Figure 3B:
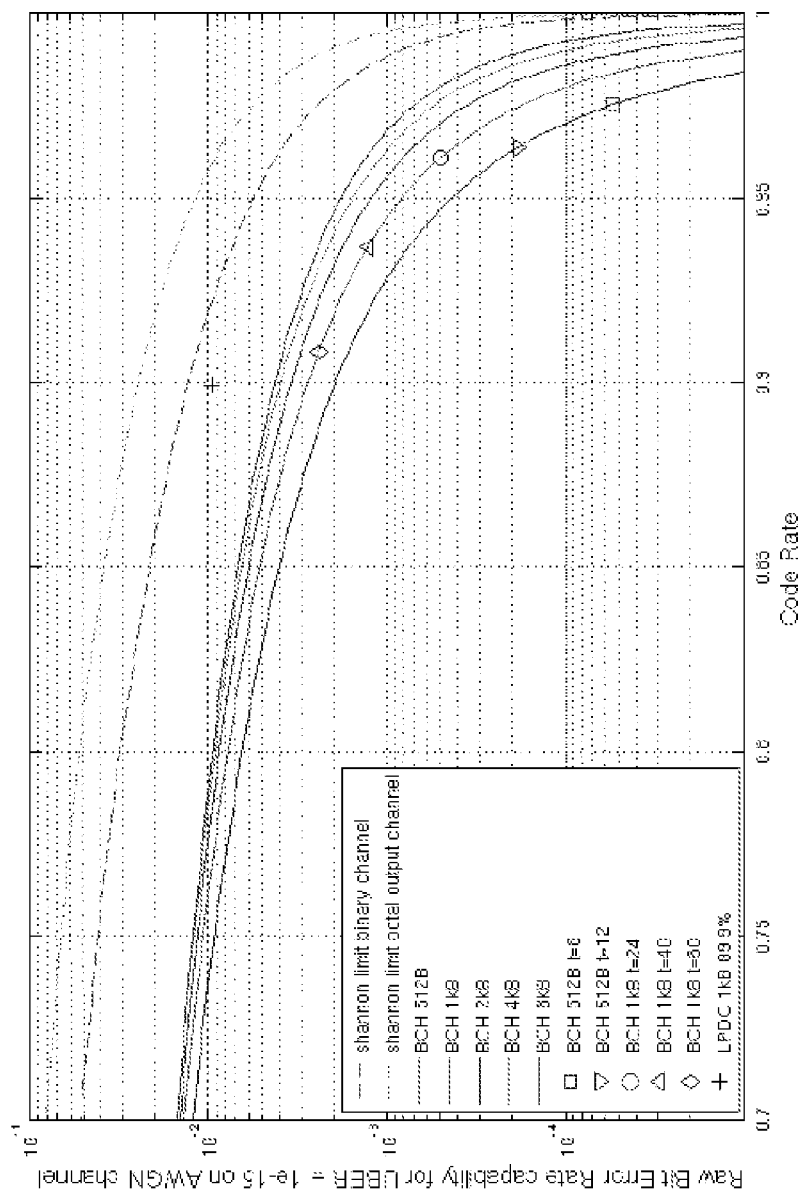
Figure 4:
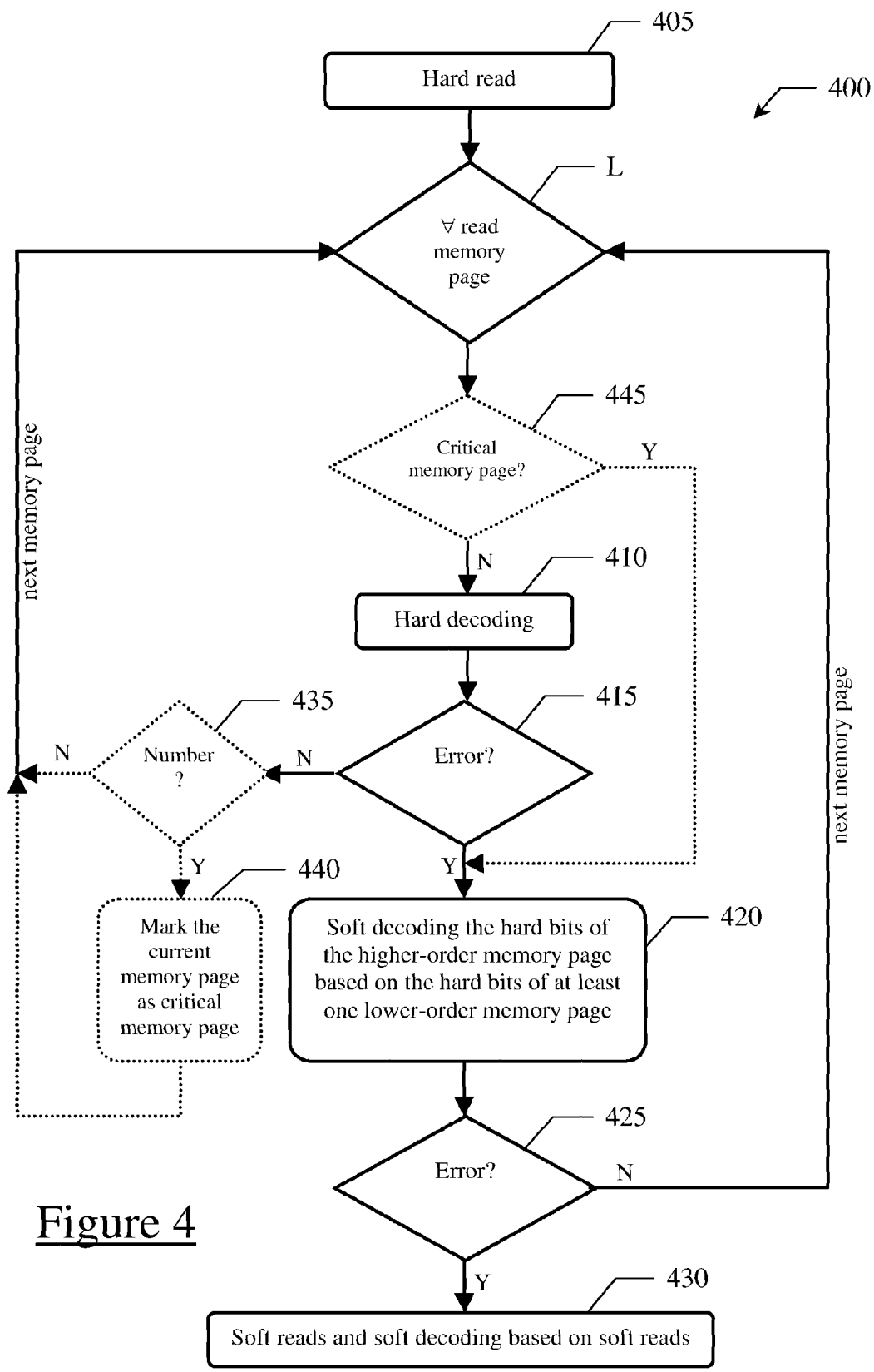

These and other features and advantages of the present invention will be made apparent by the following description of some exemplary and non-limitative embodiments thereof. For its better intelligibility, the following description should be read making reference to the attached drawings, wherein:

FIG. 1A schematically shows a simplified architecture of a SSD device known in the state of the art;

FIG. 1B schematically shows a simplified architecture of a typical SSD controller of said SSD device;

FIG. 2A schematically shows a simplified architecture of a typical flash memory die of said SSD device;

FIGS. 2B and 2C schematically show exemplary ideal and real threshold voltage distributions of MLC memory cells and of TLC memory cells, respectively, of said flash memory die;

FIG. 3A schematically shows a simplified architecture of a SSD controller according to the present invention;

FIG. 3B shows a diagram of "Raw Bit Error Rate" capability, with respect to code rate, of some exemplary ECC codes, including a "Low Density Parity Check" code that can be used in the "Forward Error Correction" unit of the SSD controller of FIG. 3A, and FIG. 4 schematically shown an activity diagram of a decoding procedure carried out by the SSD controller of FIG. 3A according to an embodiment of the present invention.

DETAILED DESCRIPTION OF PREFERRED EMBODIMENTS OF THE INVENTION

With reference to the drawings, FIG. 1A schematically shows a simplified architecture of a "Solid State Drive" device (SSD device) 100 known in the state of the art.

The SSD device 100 preferably comprises a controller (e.g., a processor and/or other control circuitry, referred to herein as SSD controller) 105, a plurality of non-volatile memory chips (e.g. flash memory chips, such as NAND flash memory chips) $110_i$ for storing bits even in the absence of external power supply (i=1, 2, 3, . . . , I, with I=64 in the example at issue), and a plurality of (e.g., synchronous and/or asynchronous) channels $115_j$ (j=1, 2, 3, . . . , J, with J=4 in the example at issue) communicably coupling the SSD controller 105 and the memory chips $110_i$ to each other—in the exemplary illustration, each channel $115_j$ communicably couples the SSD controller 105 to a set of 16 memory chips $110_i$ (e.g., with the channels $115_1$, $115_2$, $115_3$ and $115_4$ that communicably couple the SSD controller 105 to the memory chips $110_1$-$110_{16}$, $110_{17}$-$110_{32}$, $110_{33}$-$110_{48}$ and $110_{49}$-$110_{64}$, respectively).

With reference also to FIG. 1B, it schematically shows, in terms of operating units, a simplified architecture of a typical SSD controller 105—the term "unit" being herein intended to emphasize functional (rather than implementation) aspects thereof (each unit including, for example, hardware or circuitry with processing and/or storing capabilities). For the sake of completeness, such a figure also shows, with a smaller size, the memory chips $110_i$ and the channels $115_j$ (the memory chips and the channels being unnumbered in such a figure for ease of illustration).

The SSD controller 105 comprises a SSD interface unit 120 allowing data exchange (i.e., data sending and reception in a bi-directional way) between the SSD device 100 and a host (e.g., a host system such as a personal laptop computer, a desktop computer, a digital camera, a mobile telephone, or a memory card reader, not shown) having compatible receptors for the SSD interface unit 120. The SSD interface unit 120 may be in the form of a standardized interface. For example, when the SSD device 100 is used for data storage in a computing system, the SSD interface unit 120 can be a "Serial advanced technology attachment" (SATA), a "Peripheral Component Interconnect express" (PCIe), or a "Universal Serial Bus" (USB).

Data exchanged between the SSD device 100 (through the SSD interface unit 120 of the SSD controller 105) and the host may comprise, but are not limited to, information bits to be stored (i.e., the information bits to be written in the memory chips $110_i$), read information bits (i.e., the information bits stored in, and read from, the memory chips $110_i$), user commands indicative of the operations to be performed by the SSD controller 105 on the memory chips $110_i$ (such as write, read, diagnosis operations), and other control signals. For the purposes of the present description, the wording "data exchange", and derivative thereof, will be intended to mean a bi-directional exchange (i.e., sending and reception) of data between two units (although this should not be construed limitatively). This is also conceptually represented in the figure by bi-directional arrow connections between the units.

The SSD controller 105 also comprises a control unit 125 (or more thereof) for managing SSD device 100 operation, such as for receiving and processing the user commands from the SSD interface unit 120, handling bit transport to the memory chips $110_i$ along the channels $115_j$ and bit transport to and from the SSD interface unit 120, and coordinating enabling and/or disabling of the memory chips $110_i$ according to the user commands.

In order to compensate for large "Raw Bit Error Rate" (RBER), and to increase reliability of the SSD device 100, the SSD controller 105 also comprises a "Forward Error Correction" (FEC) unit 130 for locating and correcting bit errors. According to "Forward Error Correction" principles, the information bits to be stored in the memory chips $110_i$ (and provided either by the control unit 125 or, directly, from the SSD interface unit 105) are encoded in a redundant way (e.g., by adding parity bits) by means of an "Error Correction Code" (ECC code), so that redundancy allows detecting a limited number of bit errors that may occur anywhere in the read bits, and to correct these errors, during decoding, without rereading. The FEC unit 130 may comprise discrete components—such as an "Application Specific Integrated Circuit" (ASIC)—external to the control unit 125 (as herein assumed by way of example only), or the FEC unit 130 may reflect functionalities that do not necessarily have a discrete physical form separate from the control unit 125.

In order to ease bit transport between the SSD controller 105 and the memory chips $110_i$ along the respective channels $115_j$, the SSD controller 105 comprises one (as herein exemplary illustrated) or more memory interface units 135—alternatively, a memory interface unit 135 for each channel $115_j$ can be provided, or a memory interface unit 135 for each memory chip $110_i$, or for each group of memory chips $110_i$ can be provided.

As conceptually depicted in the figure by (unidirectional or bi-directional) arrow connections, which however should not be construed limitatively, the memory interface unit 135 is communicably coupled in a unidirectional manner to the SSD interface 120 (e.g., for receiving from it the information bits to be written when no ECC code is requested), and in a bi-directional manner to the control unit 125 (e.g., for receiving control information from it, such as an indication of the memory chips $110_i$ to be enabled for write or read operations, and for providing to it the read bits to be transmitted to the SSD interface unit 120) and to the FEC unit 130 (for example, for receiving encoded bits from it, e.g. including the information and parity bits, and for providing to it the read bits to be decoded before transmitting to the control unit 125, and hence to the SSD interface unit 120, the read information bits).

The SSD controller 105 further comprises a memory unit (e.g., a "Random Access Memory", RAM) 140 communicably coupled (in a bi-directional manner) to the control unit 125 for receiving and storing statistical information (such as number of program/erase cycles, and number of bit errors) and/or diagnostic information (such as working temperature, power consumption) retrieved and/or calculated by the control unit 125 (e.g. based on SSD device 100 operation and/or on sensors and/or diagnostic circuits within the SSD device 100, not shown), and, when required, for feeding the control unit 125 with the stored information.

A typical flash memory chip $110_i$ may comprise one or more flash memory dice.

A typical flash memory die, illustrated in FIG. 2A and denoted by the number reference 200, comprises one (as depicted) or more memory arrays 205 of memory cells (e.g., NAND flash memory cells) 210 arranged in rows and columns. Each memory array 205 is typically divided into multiple memory pages. Broadly speaking, each memory page comprises a number of memory cells 210 that can be programmed and read simultaneously. A number of memory pages form a memory block, and the size of the memory block equals to the product of the size of the memory page and the total number of memory pages in the memory block.

Although not shown, the memory blocks are herein assumed to feature an "All Bitline Architecture". According to "All Bitline Architecture", all bitlines of a memory block are simultaneously selected during read and programming operations. Accordingly, memory cells connected to a common wordline and connected to all the bitlines are simultaneously programmed and read. The assumption of the "All Bitline Architecture", to which the present invention in mainly (but not exclusively) intended to, arises from the fact that, in such an architecture, each memory cell 210 can be viewed as "victim" memory cell with respect to the neighbor (e.g., adjacent) memory cells (or "aggressor" memory cells)—as opposed to other architectures wherein substantially no "victim"/"aggressor" issue is, theoretically, to be expected, such as the "Odd-Even Architecture", wherein the bitlines are divided into even and odd bitlines, and the memory cells connected to the odd and even bitlines (and to a common wordline) are programmed and read separately.

Each memory cell 210 comprises a floating gate transistor (not illustrated). Each bit or group of bits (or symbol, or bit pattern) identifying a respective logical state of the memory cell 210 is physically stored in each memory cell 210 in the form of electric charge in the floating gate, which defines a corresponding threshold voltage of the transistor. The number of bits each memory cell 210 is capable of storing depends on memory cell technology. For example, in "Single-Level Cell" (SLC) technology each memory cell (or SLC memory cell) is capable of storing one symbol comprising one bit (i.e. two logical states, 0 or 1, defining, i.e. being associated with, two threshold voltages), in "Multi-Level Cell" (MLC) technology each memory cell (or MLC memory cell) is capable of storing one symbol comprising more than one bit, typically two bits (i.e. four logical states, 00, 01, 10, or 11, defining, i.e. being associated with, four threshold voltages), whereas in "Tri-Level Cell" technology each memory cell (or TLC memory cell) is capable of storing one symbol comprising three bits (i.e. eight logical states, 000, 001, 010, 011, 100, 101, 110 or 111, defining, i.e. being associated with, eight threshold voltages). In the following, explicit reference will be made to SSD devices having MLC or TLC memory cells (referred to as MLC and TLC SSD devices, respectively), which the present invention is mainly (but not exclusively) intended to.

While, ideally, all memory cells 210 in the flash memory die 200 should feature same (nominal) threshold voltages for same logical states (or, equivalently, for same symbols), practically each threshold voltage associated with a corresponding logical state (or, equivalently, associated with a corresponding symbol) differs across the memory cells 210 and defines a respective threshold voltage distribution $D_j$ (typically, a Gaussian-type probability distribution), thus resulting in a number of threshold voltage distributions $D_j$ equal to the possible logical states each memory cell 210 can take. This is schematically shown in the top drawing of FIG. 2B for a MLC memory cell and in the top drawing of FIG. 2C for a TCL memory cell.

As discussed in the introductory part of this description, the threshold voltage distributions $D_j$ are (ideally) spaced apart from one another, and a corresponding hard reference voltage $V_k$ is set between each pair of adjacent threshold voltage distributions $D_j$ for sensing/reading the logical state of the memory cells 210 (k=1, 2, 3 in the example of FIG. 2B and k=1, 2, 3, 4, 5, 6, 7 in the example of FIG. 2C).

In the case of MLC memory cell, during a read operation, a threshold voltage below the hard reference voltage $V_1$ represents the bit pattern "11", a threshold voltage between the hard reference voltages $V_1$ and $V_2$ represents the bit pattern "01", a threshold voltage between the hard reference voltages $V_2$ and $V_3$ represents the bit pattern "00", and a threshold voltage above the hard reference voltage $V_3$ represents the bit pattern "10". In the case of TLC memory cell, during a read operation, a threshold voltage below the hard reference voltage $V_1$ represents the bit pattern "111", a threshold voltage between the hard reference voltages $V_1$ and $V_2$ represents the bit pattern "011", a threshold voltage between the hard reference voltages $V_2$ and $V_3$ represents the bit pattern "001", a threshold voltage between the hard reference voltages $V_3$ and $V_4$ represents the bit pattern "101", a threshold voltage between the hard reference voltages $V_4$ and $V_5$ represents the bit pattern "100", a threshold voltage between the hard reference voltages $V_5$ and $V_6$ represents the bit pattern "000", a threshold voltage between the hard reference voltages $V_6$ and $V_7$ represents the bit pattern "010", and a threshold voltage above the hard reference voltage $V_7$ represents the bit pattern "110".

To read a memory cell 210, the threshold voltage of the memory cell 210 is compared to the hard reference voltages $V_k$. According to an embodiment, reading a memory cell 210 that stores a symbol of m bits requires, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

The two bits stored in a MLC memory cell are usually referred to as "Least Significant Bit" (LSB bit) and "Most Significant Bit" (MSB bit)—with reference to the conceptual representation of vertically arranged symbol associated with the respective threshold voltage distribution $D_j$, the LSB and MSB bits are assumed to be the top and bottom bits, respectively—whereas the three bits stored in a TLC memory cell are usually referred to as "Least Significant Bit" (LSB bit), "Center Significant Bit" (CSB bit) and "Most Significant Bit" (MSB bit)—with reference to the conceptual representation of vertically arranged symbol associated with the respective threshold voltage distribution $D_j$, the LSB, CSB and MSB bits are assumed to be the top, central and bottom bits, respectively. The terms LSB, CSB and MSB are used only as a reference to specific bits within the memory cell, and do not imply that certain bits are more important than others (in this respect, any other suitable terminology can also be used).

According to a typical implementation, different bits in a given group of memory cells 210 correspond to different memory pages.

For example, a group of eight-logical states (TLC) memory cells 210 can be used for storing three memory pages, a first page in the LSB bits of the memory cells of the group (thus referred to as LSB page), a second page in the CSB bits of the memory cells of the group (thus referred to as CSB page), and a third page in the MSB bits of the memory cells of the group (thus referred to as MSB page). Similarly, a group of four-logical states (MLC) memory cells can be used for storing LSB and MSB pages. In other words, in the "All Bitline Architecture" herein exemplary considered, all the TLC memory cells 210 of a single physical wordline belong to one LSB page, to one CSB page and to one MSB page. Similarly, all the MLC memory cells 210 of a single physical wordline belong to one LSB page and to one MSB page.

The read of MLC memory cells 210 takes place first by reading the MSB memory page (which theoretically can be read by means of the comparison of the threshold voltages of the respective transistors with the hard reference voltage $V_2$) and then by reading the LSB memory page (which theoretically can be read by means of the comparison of the threshold voltages of the respective transistors with the hard reference voltage $V_1$ or $V_3$). The read of TLC memory cells 210 takes place first by reading the MSB memory page (which theoretically can be read by means of the comparison of the threshold voltages of the respective transistors with the hard reference voltage $V_4$), then by reading the CSB memory page (which theoretically can be read by means of the comparison of the threshold voltages of the respective transistors with the hard reference voltage $V_2$ or $V_6$), and finally by reading the LSB memory page (which theoretically can be read by means of the comparison of the threshold voltages of the respective transistors with the hard reference voltage $V_1$ or $V_7$). Thus, the reading of the memory pages takes place according to an ordered sequence (from MSB memory page to LSB memory page), therefore, for the purposes of the present description, higher and lower order memory pages can be identified which reflects the above ordered sequence (for example, the LSB memory page is a lower-order memory page for the MSB and CSB memory pages, the CSB memory page is a higher-order memory page for the LSB memory page and a lower-order memory page for the MSB memory page, and the MSB memory page is a higher-order memory page for the CSB and LSB memory pages).

Back to FIG. 2A, the memory die 200 preferably comprises peripheral circuits (such as decoders, multiplexers, drivers, buffers, sense amplifiers), which, being not relevant for the present description, are represented in the figure by means of a single functional block (denoted by the number reference 215). Such peripheral circuits 215 are configured, in general, for accessing selected (pages of) memory cells (as conceptually represented in the figure by arrow connection between the peripheral circuits 215 and the memory array 205) and for running selected operations thereon (e.g. write, read, diagnosis operations).

The increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference, mainly arising from floating gate coupling effect between a target memory cell (i.e., a memory cell to be read or written) and the surrounding memory cells, and retention noise, i.e. a loss of the capability of the memory cells to retain the stored bits over time caused by progressive damage of the oxide layer (due to the high electrical fields applied at each program/erase operation) that determines an undesired flow of electrons away/in the floating gate.

Cell-to-cell interference and retention noise translate into partially overlapping areas of adjacent threshold voltage distributions $D_j$ (shown in the bottom drawings of FIGS. 2B and 2C) and, hence, into increasing of the probability of the number of bit errors per unit time (i.e., the RBER).

With reference now to FIG. 3A, it schematically shows, in terms of operating units, a simplified architecture of a SSD controller 305 according an embodiment the present invention. For the sake of completeness, such a figure also shows, in a smaller size, the memory chips $110_i$ and the channels $115_j$ (equivalent to those illustrated in the previous figures), which identify, together with the SSD controller 305, a SSD device 300. Similarly to the above, the term "unit" is herein intended to emphasize functional (rather than implementation) aspects thereof. Indeed, without losing of generality, each unit of the SSD controller 305 may be physically implemented by software, hardware, and/or a combination thereof, and/or within any pre-existing or dedicated entity. In this respect, the operating units may also intended to represent corresponding method steps of a method according to the present invention (as discussed in the following).

As visible in the figure, the SSD controller 305 comprises, similarly to the SSD controller 105, a SSD interface 320, a control unit 325, a memory interface unit 335, and a memory unit 340, which will not be discussed again for the sake of conciseness.

The SSD controller 305 also comprises an encoding unit 345 for encoding the bits to be stored in the memory array 205 (i.e., the information bits) by means of an ECC code. According to an embodiment of the present invention, the encoding unit 345, and the respective decoding unit (discussed in the following), are implemented in the FEC unit 130.

Preferably, the ECC code is an ECC code allowing soft decoding—or, otherwise stated, an ECC code that allows determining each bit value by means hard bits (i.e., the read bits resulting from comparisons to the hard reference voltages $V_k$) and of additional information comprising soft bits and an indication of the reliability of each read (hard and soft) bit typically evaluated or estimated according to RBER—the decoding based on the hard and soft bits being referred to as hard and soft decoding, respectively. More preferably, the ECC code is a "Low-Density Parity-Check" (LDPC) code—hence, the encoding unit 345 will be referred to as LDPC encoding unit 345 and the corresponding encoded bits will be referred to as LDPC encoded bits. LDPC code is a linear ECC code (constructed by using a sparse bipartite graph) that allows transmitting data over a noisy channel. LDPC code is a capacity-approaching code, which means that practical constructions exist that allow the noise threshold to be set very close to the theoretical maximum (the Shannon limit given by the Shannon theorem) for a symmetric memory-less channel.

The Shannon theorem specifies the maximum rate at which data can be transmitted over a channel of a specified bandwidth in the presence of noise. More specifically, according to the Shannon theorem, a bound on the maximum amount of error-free data that can be transmitted with a specified bandwidth in the presence of the noise interference is set, assuming that the signal power is bounded, and that the Gaussian noise process is characterized by a known power or power spectral density. The noise threshold defines an upper bound for the channel noise, up to which the probability of data errors can be made as small as desired.

Thanks to soft decoding allowed by LDPC code, for a given code rate (the ratio between the information bits to the (LDPC, in the case at issue) encoding unit and the total number of bits created by the encoding unit, the total number of bits created by the encoding unit comprising the parity bits), LDPC code approaches the Shannon limit more than ECC codes typically used in prior art solutions (such as Bose-Chaudhuri-Hocquenghem (BCH) codes), which translates into area saving while maximizing the probability of accurately recovering the bits after a read operation.

This is illustrated in FIG. 3B, which shows a diagram of "Raw Bit Error Rate", with respect to code rate, of LDPC code and of different BCH codes. In the figure it is also plotted the Shannon limit.

As visible in the figure, given a code rate of 0.9, LDPC code approaches the Shannon limit more than BCH code, whereas the same RBER can be achieved by means of the BCH code only with a code rate of 0.75 (which implies a 25% area overhead).

According to an embodiment, LDPC is a variable rate LDPC code, so that it may change the code rate depending on the RBER. Advantageously, the variable rate LDPC code is a "Quasi-Cyclic Low Density Parity Check" (QC LDPC) code. Broadly speaking, a QC LDPC code has a parity check matrix that is composed of circulant matrices of the same size. Each circulant matrix is a square matrix wherein each row is one degree of right-cyclic shift of the row above it (so that the first row is also the right-cyclic shift of the last row), and wherein each column is one degree of downward-cyclic shift of the column on the left (so that the first column is also the downward-cyclic shift of the rightmost column).

Thus, by enabling different rows/columns of the circulant matrices, the number of parity bits within the circulant matrices may be kept the same while changing the number of information bits within the circulant matrices, thus implying code rate changing. Alternatively, by splitting the rows and introducing a number of all zero circulant matrices, the number of parity bits within the circulant matrices may be changed, so that the parity check matrix becomes more sparse (and the number of parity bits and information bits, and hence the code rate, is changed).

Back to FIG. 3A, the SSD controller 305 also comprises a mapping unit 350 for "mapping" the LPDC encoded bits into mapped LDPC encoded bits (the mapped LDPC encoded bits representing the symbols to be written/programmed), thereafter the symbols can be stored in the memory chips $110_i$ (e.g., similarly to the above, by means of the memory interface unit 335 that transmits the symbols to the memory chips $110_i$, and thanks to control unit 325 action that controls addressing of the memory chips $110_i$ to be written/programmed). Preferably, as also conceptually illustrated by arrow connections between the SSD control unit 325, the encoding unit 345, the mapping unit 350, and the memory interface unit 335, the mapping unit 350 (and, hence, the mapping operation performed by it) can be selectively enabled by the control unit 325, and hence the LDPC encoded bits may be fed directly to the memory interface unit 335 when the mapping unit 350 is disabled. According to an embodiment of the present invention, selective enabling of the mapping unit 350 takes place after a predetermined number of detected failures (e.g., bit errors). Additionally or alternatively, selective enabling of the mapping unit 350 can take place after a predetermined working period of the SSD device 300 from its first use (e.g., after the program/erase cycles stored in the memory unit 340 reaches a predetermined number), e.g. in order to compensate for decreasing performance affecting the SSD device 300 with its use.

The SSD controller 305 further comprises demapping 355 and LDPC decoding 360 units for carrying out demapping and decoding operations to the read symbols in order to extract the information bits therefrom (the demapping and LDPC decoding operations being substantially reverse operations with respect to the encoding and mapping operations carried out at LDPC encoding 345 and mapping 350 units, respectively).

The mapping 350 and demapping 355 units are not limiting for the present invention. By way of example only, the mapping 350 and demapping 355 units may be implemented as disclosed in the U.S. patent application Ser. No. 14/789,513, and/or in the in the U.S. patent application Ser. No. 14/789,513, and/or in the U.S. patent application Ser. No. 14/789,513, and/or in the U.S. patent application Ser. No. 14/789,522, whose disclosures are herein incorporated by reference.

The LDPC decoding unit 360 is preferably configured to perform both hard and soft decoding of the read bits, more preferably the LDPC decoding unit 360 is configured to output, together with the hard or soft decoded bits, an outcome of the hard or soft decoding (e.g., an indication of a decoding success or failure), even more preferably the LDPC decoding unit 360 is configured to output an indication of a number of errors of a successful decoding. As mentioned above, by hard decoding it is meant the decoding based on the hard bits, i.e. the read bits resulting from comparisons to the hard reference voltages $V_k$, whereas by soft decoding it is meant the decoding based on the soft bits, i.e. the read bits resulting from comparisons to the soft reference voltages $V_{kA}$-$V_{kF}$, and on an indication of the reliability of the read soft bits.

Preferably, the indication of the reliability of each read soft bit is in the form of a "Log Likelihood Ratio" value (LLR, hereinafter, LLR value) associated with that bit (i.e., a weight indicative of the probability that the read bit is correct). By way of example only, in order to meet one or more parity checks of the ECC code, an LLR value higher than 0 may indicate a bit that is more likely a 0 than a 1, while an LLR value lower than 0 may indicate a bit that is more likely a 1 than a 0. Further, a greater magnitude of the LLR value may indicate a higher probability or reliability. Thus, a bit with an LLR value equal to 63 is more likely to be a 0 than a bit with an LLR value equal to 5, and a bit with an LLR value equal to −63 is more likely to be a 1 than a bit with an LLR value equal to −5. An LLR value equal to 0 may instead indicate that the bit is equally likely to be a 0 or a 1. By way of example only, for a given RBER, the LLR values for a set of four read bits may be [50, 5, −5, −50].

The soft bits mainly arise from multiple read operations. Indeed, when a read operation takes place on the selected memory cells, and the number of bit errors is found to be higher than correction capabilities of the "Forward Error Correction", the SSD controller 305 is configured to reread the selected memory cells at different values of the reference voltages to attempt to establish the bits in those areas of the threshold voltage distributions $D_j$ wherein bit error is most likely. As visible in the bottom drawings of FIGS. 2B and 2C, such multiple readings are carried out by moving the hard reference voltages $V_k$ in a neighborhood thereof, thus obtaining a number of additional reference voltages (or soft reference voltages) $V_{kA}$-$V_{kF}$ associated with each hard reference voltage $V_k$—the read operations at the soft reference voltages $V_{kA}$-$V_{kF}$ provide the soft bits, and are typically denoted as soft read operations (as opposed to the read operations at the hard reference voltages $V_k$ providing the hard bits, which are typically denoted by hard read operations). In other words, soft bits (and the associated LLR values) provide additional information that can be used by the LDPC decoding unit 360 to speed up and/or to quickly converge. By way of example only, the soft reference voltages $V_{kA}$-$V_{kC}$ may be obtained by progressively decreasing the hard reference voltage $V_k$ by a 0.5V step, whereas the soft reference voltages $V_{kD}$-$V_{kF}$ may be obtained by progressively increasing the hard reference voltage $V_k$ by a 0.5V step.

In the following, for the sake of conciseness, the overall reference voltages including both the hard reference voltages $V_k$ and the associated soft reference voltages $V_{kA}$-$V_{kF}$ will be also denoted, as a whole, by reference voltages $V_{kA}$, $V_{kA}$-$V_{kF}$.

In its widest conception, the present invention is based on:

hard reading first and second bits of a selected group of memory cells (for example, as in the assumed embodiment discussed below, the first bits of a row of memory cells identifying a memory page, and the second bits of the same row of memory cells identifying a different memory page), and soft decoding the read first bits, with the soft information exploited for soft decoding the read first bits that are based on the hard read second bits.

In other words, the (hard) read first bits are soft decoded by exploiting as soft information the (hard) read second bits (and/or one or more (hard) read further bits, in case of multiple bits per memory cell). As should be readily understood, the choice which (hard) read bit to use as soft information may depend on various design options, such as the used bit pattern coding scheme (roughly, the "association" between the bit patterns and the reference voltages). For this reason, although in the following discussed embodiments explicit reference will be made to the higher-order and lower-order memory pages, whose notion is well suited to the exemplary bit pattern coding scheme illustrated in FIGS. 2B and 2C, according to the principles of the present invention any proper bit grouping may be regarded as the first and second bits. Just as an example, the first and second bits may be identified, respectively, by the second and fourth memory pages of a row of 4-bit-per-cell memory cells when, as a result of the used bit pattern coding scheme, these memory pages are logically "coupled" to each other (i.e., when, as a result of the used bit pattern coding scheme, the hard bits of one memory page are useful information for decoding the read bits of the other memory page).

With reference now to FIG. 4, it schematically shows, according to an embodiment of the present invention, an activity diagram of a decoding procedure 400 carried out by the SSD controller 300. In the following, when discussing the activity diagram, reference will be mainly made to MLC memory cells for ease of description, it being understood that the principles of the present invention still apply to TLC memory cells or to memory cells storing (each one) more than three bits.

According to the illustrated embodiment, the decoding procedure 400 is based on reading (action node 405) the memory pages (of selected memory cells to be read) based on the hard reference voltages $V_k$ (i.e., hard reading the memory pages thereby obtaining the corresponding hard bits), the concurrent reading of all the memory pages being allowed by the "All Bitline Architecture" herein assumed, and soft decoding the read hard bits of each memory page based on the read hard bits of at least one among the respective lower-order memory pages (action node 420)— or, more generally, as discussed above, based on the read hard bits of at least one other memory page "coupled" thereto. In other words, according an embodiment of the present invention, the hard bits of each lower-order memory page are used, by the soft decoding unit 360, as soft information for soft decoding the hard bits of a higher-order memory page (i.e., when considering MLC memory cells 210, the hard bits of the LSB memory page are used as soft information for soft decoding the hard bits of the MSB memory page, and, when considering TLC memory cells 210, the hard bits of the LSB memory page are used as soft information for soft decoding the hard bits of at least the CSB memory page, and the hard bits of the CSB memory page are used as soft information for soft decoding the hard bits of the MSB memory page).

According to an embodiment of the present invention, the decoding procedure 400 starts by hard reading the MSB memory pages of the selected memory cells and, at the same time, hard reading the lower-order memory pages (i.e., the CSB memory page, when provided, and the LSB memory page of the same selected memory cells)—action node 405. It should be noted that the hard read of the adjacent memory pages is useful to compensate for the above-mentioned floating gate coupling effect and can be effective in properly weighting the LLR values.

Then, the decoding procedure 400 is iteratively carried out as follows. Preferably, the decoding procedure 400 is iteratively carried out for each memory page (as conceptually illustrated by control node L), more preferably the decoding procedure 400 is iteratively carried out following a proper succession of memory pages, even more preferably the decoding procedure 400 is iteratively carried out from the highest-order memory page at the first iteration (i.e., the MSB memory page in the considered example) to the lowest-order memory page over the following iterations— the (MSB, CSB, or LSB) memory page that is under processing during a current iteration will be referred to as current memory page.

As hard decoding could be, alone, successful in recovering a valid codeword after receiving only the hard bits, the present invention preferably provides for determining whether hard decoding of the current memory page has been successful before performing any additional reads to recover reliability data. In order to achieve that, the decoding procedure 400 preferably comprises, after said hard reading of the memory pages, hard decoding the read hard bits of the higher-order memory page (action node 410) and checking (decision node 415), e.g. at the control unit 325 side, the success or failure of the hard decoding (based on the outcome of the decoding output by the LDPC decoding unit 360), so that the soft decoding of the read hard bits of the higher-order memory page (the MSB memory page, at the first iteration) based on the read hard bits of one or more lower-order memory page (the CSB and/or the LSB memory page) is carried out only if the hard decoding has failed (see connection between exit branch Y of the decision node 415, indicating the failure of the hard decoding, and the action node 420). According to an embodiment of the present invention, when the current memory page is the MSB memory page, the read hard bits of the adjacent lower-order memory page (i.e., the CSB memory page) are used as soft information. Additionally or alternatively, the read hard bits of another lower-order memory page (e.g., the LSB memory page) may be used as soft information, for example according to the used bit pattern coding scheme. According to a different embodiment of the present invention, not shown, the read hard bits of the adjacent lower-order memory page (i.e., the CSB memory page) are first used as soft information, and, in case that soft decoding based on the read hard bits is unsuccessful, the read hard bits of the next lower-order memory pages are then used, until the LSB memory page. However, according to the principles of the present invention set out above, different memory pages and/or a different succession (order) of memory pages may be considered over the iterations of the decoding procedure 400.

Back to the activity diagram, after soft decoding, a further check is preferably performed (decision node 425) for checking, e.g. still at the control unit 325 side, the success or failure of the soft decoding (e.g., based on the outcome of the decoding output by the LDPC decoding unit 360). If the soft decoding has been successful, exit branch N of the decision node 425, it meaning that soft decoding of the hard bits of the current higher-order memory page based on the hard bits of the (one or more) lower-order memory page has been sufficient to recover a valid codeword, the next memory page associated with the same selected memory cells (e.g., the immediately following lower-order memory page, the LSB memory page when considering MLC memory cells 210 or the CSB memory page when considering TLC memory cells) is considered and the decoding procedure 400 is repeated as such for it. This is conceptually represented in the figure by arrow connection between the decision node 425 and the control node L, and by the wording "next memory page" along the arrow connection.

If instead the soft decoding of the hard bits of the higher-order memory page based on the hard bits of one or more lower-order memory pages has not been sufficient to recover a valid codeword, exit branch Y of the decision node 425, soft read and soft decoding operations can take place as usual (action node 430). For example, the soft read and soft decoding operations may comprise reading the memory pages based on the reference voltages $V_{kA}$-$V_{kF}$ thereby obtaining, for each read bit, a reliability of the read bit (or bit reliability), e.g. in terms of LLR values, and soft decoding the read bits based on the bit reliabilities (as mentioned above, according to an embodiment of the present invention, the LLR values can be properly evaluated further based on the hard reads of the adjacent memory pages).

Back to the decision node 415, according to an embodiment of the present invention, if the hard decoding of the (current) higher-order memory page has not failed (exit branch N of the decision node 415), it meaning that the hard decoding has been, alone, successful in recovering a valid codeword based only on the hard bits, the next memory page associated with the same selected memory cells is considered and the decoding procedure 400 is repeated as such for it (as conceptually represented in the figure by arrow connection between the decision node 415 and the control node L and by the wording "next memory page" along the arrow connection).

As should be readily understood, in the considered embodiment, no lower-order memory page exists for the LSB memory page, so that, when the LSB memory page is processed, soft decoding of the respective hard bits carried out at action node 420 cannot be performed. In this case, according to an embodiment of the present invention, not shown, the decoding procedure 400 may jump from the decision node 415 to the action node 430, where usual soft reads and soft decoding based on the soft reads takes place—the provision of the hard decoding of the hard bits of the LSB memory page and of the check on the success or failure of the hard decoding carried out at action 410 and decision 415 nodes, respectively, being still preferable since hard decoding could be, alone, successful in recovering a valid codeword after receiving only the hard bits.

Thus, thanks to the present invention, the soft reads, which are the most limiting operations in terms of latency, are performed only when strictly necessary, thus increasing the performance of the SSD device.

According to an embodiment of the present invention, the decoding procedure 400 is further arranged for exploiting the preferred functionality of the LDPC decoding unit 360 of outputting an indication of a number of errors of a successful decoding. This embodiment is graphically described in FIG. 4 by additional nodes 435-445, discussed herebelow, and whose optional character is conceptually represented by dashed lines.

As visible in the figure, according to this embodiment, if the hard decoding of the current memory page has not failed (exit branch N of the decision node 415), it meaning that the hard decoding has been, alone, successful in recovering a valid codeword based only on the hard bits, a further check is performed (decision node 435) aimed at comparing (e.g., at the control unit 325 side) the number of errors having affected the successful hard decoding with respect to a predetermined number of errors. Preferably, the predetermined number of errors is indicative of a high probability that a successful hard decoding of the current memory page will fail at the following hard decoding of the same memory page (indeed, nowadays SSD devices typically provide a high number of silent processes involving multiple decoding of same memory pages, such as for verifying the correct writing of the memory pages after refresh operations).

If, as a result of such a comparison, the number of errors of the hard decoded bits of the current memory page is lower than (or, at most, equal to) the predetermined number of errors (exit branch N of the decision node 435), the next memory page associated with the same selected memory cells is considered as discussed above (see arrow connection between the decision node 435 and the control node L).

Otherwise (exit branch Y of the decision node 435), the current memory page is marked as critical memory page (action node 440) for its following hard decoding, and this information is preferably stored (for example, in a proper memory location, not shown, of the control unit 325), thereafter the next memory page is considered as discussed above (see arrow connection between the action node 440 and the control node L).

According to this embodiment, a further check is performed (decision node 445), preferably before hard decoding (action node 410), aimed at checking whether the current memory page is a critical memory page. In the affirmative case, (exit branch Y of the decision node 445) the decoding procedure 400 directly jumps to action node 420 (where soft decoding of the hard read bits of the higher-order memory page based on the hard bits of at least one lower-order memory page takes place), thereby avoiding that a hard decoding that is expected to fail with a certain probability is uselessly performed (thus reducing SSD device latency), otherwise (exit branch N of the decision node 445), the decoding procedure 400 is carried out from action node 410 on (as discussed above).

Naturally, in order to satisfy local and specific requirements, a person skilled in the art may apply to the present invention as described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

What is claimed is:

1. Method for decoding bits stored in memory cells of a solid state drive, wherein each memory cell comprises a floating gate transistor adapted to store a bit pattern, among a plurality of possible bit patterns, when programmed at a threshold voltage associated with that bit pattern, each threshold voltage being variable over the memory cells thereby defining, for each bit pattern, a corresponding threshold voltage distribution, wherein the bit pattern of each memory cell comprises first and second bits, and wherein the solid state drive is suitable for reading the bit patterns based on fixed reference voltages, each one designed to discern between two respective adjacent threshold voltage distributions, and on additional reference voltages different from the fixed reference voltages, and wherein the solid state drive is capable of soft decoding the read bit patterns based on soft information, and wherein the method comprises:
   reading the first and second bits of the memory cells based on the fixed reference voltages, to obtain read first bits and read second bits, and
   soft decoding the read first bits, wherein the soft information exploited for soft decoding the read first bits are based on the read second bits.

2. The method of claim 1, further comprising, after said reading the first and second bits based on the fixed reference voltages, hard decoding the read first bits, wherein said soft decoding the read first bits is carried out in case of a failure of said hard decoding.

3. The method of claim 1, wherein said fixed reference voltages comprise a first fixed reference voltage, and second and third fixed reference voltages lower and higher, respectively, than the first fixed reference voltage, and wherein said reading the first and second bits based on the fixed reference voltages comprises reading the first bits based on the first fixed reference voltage, and reading the second bits based on the second and third fixed reference voltages, the method further comprising, if a number of errors of the soft decoded first bits is higher than a predetermined number of errors:
   determining a reliability of each read first bit based on at least one additional reading of the first bits, said additional reading being based on at least one first additional reference voltage in the neighborhood of the first fixed reference voltage, wherein the soft information exploited for soft decoding the read first bits are based also on said reliability of each read first bit.

4. The method of claim 1, wherein the solid state drive is designed to read the memory cells at memory page level, the first and second bits of the bit patterns stored in the memory cells identifying, as a whole, first and second memory pages, respectively, of the solid state drive.

5. The method of claim 4, wherein the first and second memory pages are adjacent memory pages.

6. The method of claim 1, wherein each memory cell is capable of storing a bit pattern of two bits, the first and second bits of each memory cells representing, respectively, most and least significant bits of the respective bit pattern.

7. The method of claim 1, wherein each memory cell is capable of storing a bit pattern of three bits comprising a third bit, the first, second and third bits of each memory cells representing, respectively, most, central and least significant bits of the respective bit pattern.

8. The method of claim 7, further comprising:
   reading the third bits of the memory cells based on the fixed reference voltages, thereby obtaining read third bits, the soft information exploited for soft decoding the read first bits being based also on the read third bits.

9. The method of claim 7, further comprising:
   hard decoding the read second bits, and
   if a number of errors of the hard decoded second bits is higher than a predetermined number of errors,
      reading the third bits of the memory cells based on the fixed reference voltages, thereby obtaining read third bits, and
      soft decoding the read second bits, wherein the soft information exploited for soft decoding the read second bits are based on the read third bits.

10. The method of claim 1, further comprising, after said hard decoding the read first bits:
    if said hard decoding is successful, determining a number of errors of the decoded read first bits, and
    if the number of errors of the decoded read first bits is higher than a predetermined number of errors indicative that the hard decoding of the same read first bits is expected to fail at a following hard decoding, identifying the read first bits as critical read first bits,
    said hard decoding the read first bits comprising hard decoding only the read first bits that are not critical read first bits.

11. The method of claim 1, wherein said soft decoding is based on a "Low Density Parity Check" (LDPC) code.

12. Controller for a solid state drive, wherein the solid state drive comprises memory cells each one having a floating gate transistor adapted to store a bit pattern, among a plurality of possible bit patterns, when programmed at a threshold voltage associated with that bit pattern, each threshold voltage being variable over the memory cells thereby defining, for each bit pattern, a corresponding threshold voltage distribution, wherein the bit pattern of each memory cell comprises first and second bits, and wherein the controller comprises a control unit arranged for:
    causing a reading unit to read the first and second bits of the memory cells based on fixed reference voltages to obtain read first bits and read second bits, wherein each fixed reference voltage is designed to discern between two respective adjacent threshold voltage distributions, and causing a soft decoding unit to soft decode the read first bits based on soft information, wherein the soft information exploited for soft decoding the read first bits are based on the read second bits.

13. The controller of claim 12, wherein the control unit is further arranged for causing a hard decoding unit to hard decode the read first bits after said reading the first and second bits based on the fixed reference voltages, wherein the control unit is arranged for causing the soft decoding unit to soft decode the read first bits in case of a failure of said hard decoding.

14. The controller of claim 12, wherein said reference voltages comprise a first fixed reference voltage, and second and third fixed reference voltages lower and higher, respectively, than the first fixed reference voltage, and wherein said causing the reading unit to read the first and second bits based on the fixed reference voltages comprises causing the reading unit to read the first bits based on the first fixed reference voltage, and to read the second bits based on the second and third fixed reference voltages, the control unit is further arranged for, if a number of errors of the soft decoded first bits is higher than a predetermined number of errors:
  determining a reliability of each read first bit based on at least one additional reading of the first bits, said additional reading being based on at least one first additional reference voltage in the neighborhood of the first fixed reference voltage, wherein the soft information exploited for soft decoding the read first bits are based also on said reliability of each read first bit.

15. The controller of claim 12, wherein the memory cells are read at memory page level, the first and second bits of the bit patterns stored in the memory cells identifying, as a whole, first and second memory pages, respectively, of the solid state drive.

16. The controller of claim 15, wherein the first and second memory pages are adjacent memory pages.

17. The controller of claim 12, wherein each memory cell is capable of storing a bit pattern of two bits, the first and second bits of each memory cells representing, respectively, most and least significant bits of the respective bit pattern.

18. The controller of claim 12, wherein each memory cell is capable of storing a bit pattern of three bits comprising a third bit, the first, second and third bits of each memory cells representing, respectively, most, central and least significant bits of the respective bit pattern.

19. The controller of claim 18, wherein the control unit is further arranged for causing the reading unit to read the third bits of the memory cells based on the fixed reference voltages, thereby obtaining read third bits, the soft information exploited for soft decoding the read first bits being based also on the read third bits.

20. The controller of claim 18, wherein the control unit is further arranged for:
  causing a hard decoding unit of the solid state drive to hard decode the read second bits, and
  if a number of errors of the hard decoded second bits is higher than a predetermined number of errors,
    causing the reading unit to read the third bits of the memory cells based on the fixed reference voltages, thereby obtaining read third bits, and
    causing the soft decoding unit to soft decode the read second bits, wherein the soft information exploited for soft decoding the read second bits are based on the read third bits.

21. The controller of claim 13, wherein the control unit is further arranged for, after said hard decoding the read first bits:
  if said hard decoding is successful, determining a number of errors of the decoded read first bits, and
  if the number of errors of the decoded read first bits is higher than a predetermined number of errors indicative that the hard decoding of the same read first bits is expected to fail at a following hard decoding, identifying the read first bits as critical read first bits,
said hard decoding the read first bits comprising hard decoding only the read first bits that are not critical read first bits.

22. The controller of claim 12, wherein said soft decoding is based on a "Low Density Parity Check" (LDPC) code.

23. Solid state drive comprising:
  memory cells each one having a floating gate transistor adapted to store a bit pattern, among a plurality of possible bit patterns, when programmed at a threshold voltage associated with that bit pattern, each threshold voltage being variable over the memory cells thereby defining, for each bit pattern, a corresponding threshold voltage distribution, wherein the bit pattern of each memory cell comprises first and second bits, and a control unit arranged for:
  causing a reading unit to read the first and second bits of the memory cells based on fixed reference voltages to obtain read first bits and read second bits, wherein each fixed reference voltage is designed to discern between two respective adjacent threshold voltage distributions, and
  causing a soft decoding unit to soft decode the read first bits based on soft information, wherein the soft information exploited for soft decoding the read first bits are based on the read second bits.

24. The solid state drive of claim 23, wherein the control unit is further arranged for causing a hard decoding unit to hard decode the read first bits after said reading the first and second bits based on the fixed reference voltages, wherein the control unit is arranged for causing the soft decoding unit to soft decode the read first bits in case of a failure of said hard decoding.

25. The solid state drive of claim 23, wherein said reference voltages comprise a first fixed reference voltage, and second and third fixed reference voltages lower and higher, respectively, than the first fixed reference voltage, and wherein said causing the reading unit to read the first and second bits based on the fixed reference voltages comprises causing the reading unit to read the first bits based on the first fixed reference voltage, and to read the second bits based on the second and third fixed reference voltages, the control unit is further arranged for, if a number of errors of the soft decoded first bits is higher than a predetermined number of errors:
  determining a reliability of each read first bit based on at least one additional reading of the first bits, said additional reading being based on at least one first additional reference voltage in the neighborhood of the first fixed reference voltage, wherein the soft information exploited for soft decoding the read first bits are based also on said reliability of each read first bit.

26. The solid state drive of claim 23, wherein the memory cells are read at memory page level, the first and second bits of the bit patterns stored in the memory cells identifying, as a whole, first and second memory pages, respectively, of the solid state drive.

27. The solid state drive of claim 26, wherein the first and second memory pages are adjacent memory pages.

28. The solid state drive of claim 23, wherein each memory cell is capable of storing a bit pattern of two bits, the first and second bits of each memory cells representing, respectively, most and least significant bits of the respective bit pattern.

29. The solid state drive of claim 23, wherein each memory cell is capable of storing a bit pattern of three bits comprising a third bit, the first, second and third bits of each memory cells representing, respectively, most, central and least significant bits of the respective bit pattern.

30. The solid state drive of claim 29, wherein the control unit is further arranged for causing the reading unit to read the third bits of the memory cells based on the fixed reference voltages, thereby obtaining read third bits, the soft information exploited for soft decoding the read first bits being based also on the read third bits.

31. The solid state drive of claim 29, wherein the control unit is further arranged for:
   causing a hard decoding unit of the solid state drive to hard decode the read second bits, and
   if a number of errors of the hard decoded second bits is higher than a predetermined number of errors,
      causing the reading unit to read the third bits of the memory cells based on the fixed reference voltages, thereby obtaining read third bits, and
      causing the soft decoding unit to soft decode the read second bits, wherein the soft information exploited for soft decoding the read second bits are based on the read third bits.

32. The solid state drive of claim 24, wherein the control unit is further arranged for, after said hard decoding the read first bits:
   if said hard decoding is successful, determining a number of errors of the decoded read first bits, and
   if the number of errors of the decoded read first bits is higher than a predetermined number of errors indicative that the hard decoding of the same read first bits is expected to fail at a following hard decoding, identifying the read first bits as critical read first bits,
said hard decoding the read first bits comprising hard decoding only the read first bits that are not critical read first bits.

33. The solid state drive of claim 23, wherein said soft decoding is based on a "Low Density Parity Check" (LDPC) code.

34. The solid state drive of claim 23, wherein said soft decoding unit is based on a "Low Density Parity Check" (LDPC) code.

35. The solid state drive according to claim 23, wherein the memory cells are flash memory cells.

36. The solid state drive according to claim 23, wherein said memory cells are NAND flash memory cells.

* * * * *